US009165867B1

(12) United States Patent
Cadag et al.

(10) Patent No.: US 9,165,867 B1
(45) Date of Patent: Oct. 20, 2015

(54) SEMICONDUCTOR DEVICE WITH LEAD FRAME CONTACT SOLDER BALLS AND RELATED METHODS

(71) Applicant: STMICROELECTRONICS, INC., Calamba, Laguna (PH)

(72) Inventors: Ela Mia Cadag, Laguna (PH); Jefferson Talledo, Laguna (PH)

(73) Assignee: STMICROELECTRONICS, INC., Calamba, Laguna (PH)

( * ) Notice: Subject to any disclaimer, the term of this patent is extended or adjusted under 35 U.S.C. 154(b) by 0 days.

(21) Appl. No.: 14/449,492

(22) Filed: Aug. 1, 2014

(51) Int. Cl.
*H01L 23/495* (2006.01)
*H01L 23/28* (2006.01)
*H01L 23/00* (2006.01)

(52) U.S. Cl.
CPC .......... *H01L 23/49541* (2013.01); *H01L 23/28* (2013.01); *H01L 24/17* (2013.01); *H01L 24/49* (2013.01); *H01L 24/81* (2013.01)

(58) Field of Classification Search
CPC ................. H01L 2924/00; H01L 2224/48465; H01L 2224/4826; H01L 2224/85205; H01L 2224/48247; H01L 2224/16; H01L 2224/48227; H01L 2924/0002; H01L 2224/73253; H01L 2224/18; H01L 2224/81052; H01L 2225/1064
See application file for complete search history.

(56) References Cited

U.S. PATENT DOCUMENTS

| | | | |
|---|---|---|---|
| 5,045,914 A * | 9/1991 | Casto et al. | 257/693 |
| 5,072,283 A | 12/1991 | Bolger | |
| 5,383,094 A | 1/1995 | Estes | |
| 5,844,315 A * | 12/1998 | Melton et al. | 257/738 |
| 5,977,565 A | 11/1999 | Ishikawa et al. | |
| 6,222,967 B1 | 4/2001 | Amano et al. | |
| 6,544,813 B1 | 4/2003 | Lin | |
| 6,627,824 B1 | 9/2003 | Lin | |
| 6,706,971 B2 | 3/2004 | Albert et al. | |
| 7,205,653 B2 | 4/2007 | Brandenburg et al. | |
| 7,485,957 B2 | 2/2009 | Brandenburg et al. | |
| 8,026,597 B2 | 9/2011 | Brandenburg et al. | |
| 8,471,380 B2 | 6/2013 | Brandenburg et al. | |
| 2002/0100600 A1 | 8/2002 | Albert et al. | |
| 2002/0126459 A1 | 9/2002 | Albert et al. | |
| 2011/0065240 A1 | 3/2011 | Gao et al. | |
| 2011/0169153 A1 * | 7/2011 | Tsukamoto et al. | 257/676 |
| 2014/0167262 A1 * | 6/2014 | Yap | 257/738 |

* cited by examiner

*Primary Examiner* — Roy Potter
*Assistant Examiner* — Paul Patton
(74) *Attorney, Agent, or Firm* — Allen, Dyer, Doppelt, Milbrath & Gilchrist, P.A.

(57) ABSTRACT

A semiconductor device may include an integrated circuit (IC), and lead frame contact areas adjacent the IC. Each lead frame contact area may have an opening therein. The semiconductor device may include bond wires, each bond wire coupling a respective lead frame contact area with the IC. The semiconductor device may also include encapsulation material surrounding the IC, the lead frame contact areas, and the bond wires. Solder balls are within the respective opening.

18 Claims, 4 Drawing Sheets

SEMICONDUCTOR DEVICE WITH LEAD FRAME CONTACT SOLDER BALLS AND RELATED METHODS

TECHNICAL FIELD

The present disclosure relates to the field of electronic devices, and, more particularly, to semiconductor devices and related methods.

BACKGROUND

In electronic devices with integrated circuits (ICs), the ICs are typically mounted onto circuit boards. In order to electrically couple connections between the circuit board and the IC, the IC is typically "packaged." The IC packaging usually provides a small encasement for physically protecting the IC and provides contact pads for coupling to the circuit board. In some applications, the packaged IC may be coupled to the circuit board via solder bumps.

One approach to IC packaging comprises a quad-flat no-leads (QFN) package. The QFN package may provide some advantages, such as reduced lead inductance, a near chip scale footprint, thin profile, and low weight. Also, the QFN package typically includes perimeter I/O pads to ease circuit board trace routing, and the exposed copper die-pad technology offers enhanced thermal and electrical performance. QFN packaging may be well suited for applications where size, weight, and thermal and electrical performance are important.

Referring initially to FIG. 1, a typical electronic device 100 is now described. The electronic device 100 includes ball contacts 103a-103d, and contact pads 104a-104d adjacent thereto. The electronic device 100 also includes a die pad 105, an IC 101 on the die pad, bond wires 106a-106d coupling the contact pads and the IC, and encapsulation material 102 on the IC. Potential issues with this electronic device 100 may include ball contact 103a-103d detachment.

Referring now to FIG. 2, another typical electronic device 200 is now described. The electronic device 200 includes a circuit board 203, ball contacts 205a-205f attached to the circuit board, and solder resist 204 adjacent thereto. The electronic device 200 also includes an IC 206 on the circuit board 203, bond wires 202a-202b coupling to the IC, and encapsulation material 201 on the IC. Potential issues with this electronic device 200 may include ball contact 205a-205f detachment, high manufacturing cost, and increased thickness.

SUMMARY

Generally, a semiconductor device may include at least one IC, and a plurality of lead frame contact areas adjacent the at least one IC, with each lead frame contact area having an opening therein. The semiconductor device may include a plurality of bond wires, with each bond wire coupling a respective lead frame contact area with the at least one IC. The semiconductor device may also include encapsulation material surrounding the at least one IC, the plurality of lead frame contact areas, and the plurality of bond wires. The semiconductor device may include a plurality of solder balls, with each solder ball within the respective opening.

In some embodiments, each of the openings may comprise a through-opening extending through a corresponding lead frame contact area, and each of the solder balls may fill the respective through-opening and extend outwardly therefrom. In other embodiments, each of the openings may comprise a blind-opening extending partially through the respective lead frame contact area, and each of the solder balls may be positioned in the respective blind-opening and extend outwardly therefrom.

Additionally, each of the solder balls may be laterally spaced outwardly from a respective bond wire. The semiconductor device may further comprise at least one IC die pad below the at least one IC. The semiconductor device may also comprise an adhesive layer between the at least one IC and the at least one IC die pad. For example, each lead frame contact area may have a rectangular shape, and the plurality of lead frame contact areas may comprise copper.

Another aspect is directed to a method for making a semiconductor device. The method may include positioning a plurality of lead frame contact areas adjacent at least one IC, with each lead frame contact area having an opening therein, coupling a plurality of bond wires between respective lead frame contact areas and the at least one IC. The method may include forming encapsulation material surrounding the at least one IC, the plurality of lead frame contact areas, and the plurality of bond wires. The method may also include forming a plurality of solder balls, with each solder ball within the respective opening.

DETAILED DESCRIPTION

The present disclosure will now be described more fully hereinafter with reference to the accompanying drawings, in which several embodiments of the invention are shown. This present disclosure may, however, be embodied in many different forms and should not be construed as limited to the embodiments set forth herein. Rather, these embodiments are provided so that this disclosure will be thorough and complete, and will fully convey the scope of the present disclosure to those skilled in the art. Like numbers refer to like elements throughout, and prime notation is used to indicate similar elements in alternative embodiments.

Figure 1:
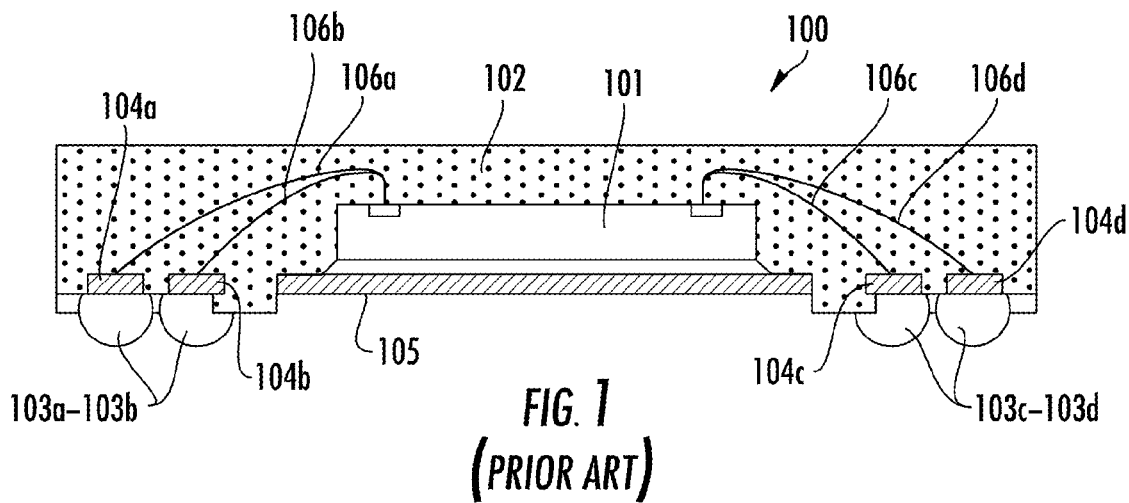
FIGS. 1-2 are schematic diagrams of cross-sectional views of electronic devices, according to the prior art.
Figure 2:
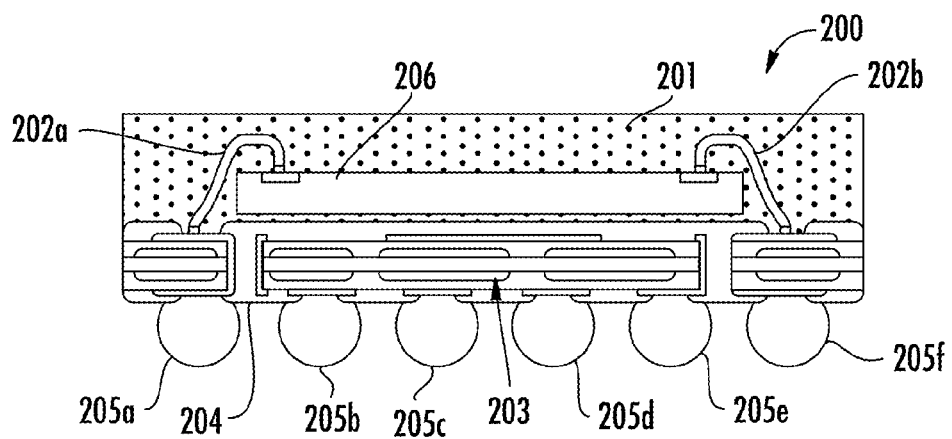
Figure 3A:
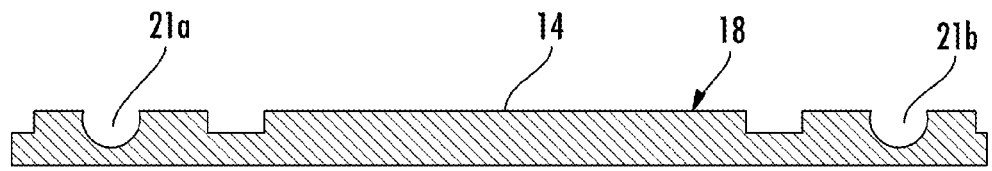
FIGS. 3A-3D are schematic diagrams of cross-sectional views of steps in making a semiconductor device, according to the present disclosure.
Figure 3B:
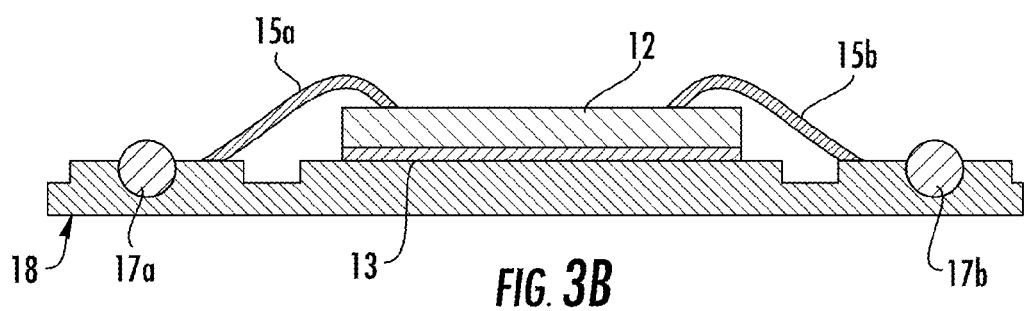
Figure 3C:
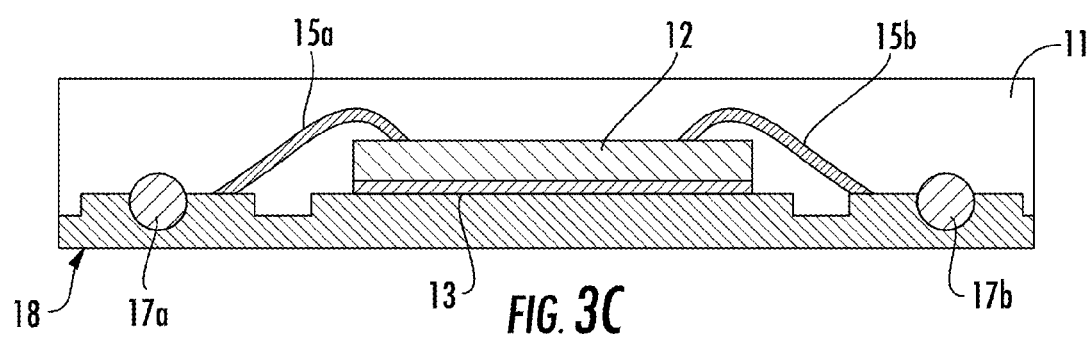
Figure 3D:
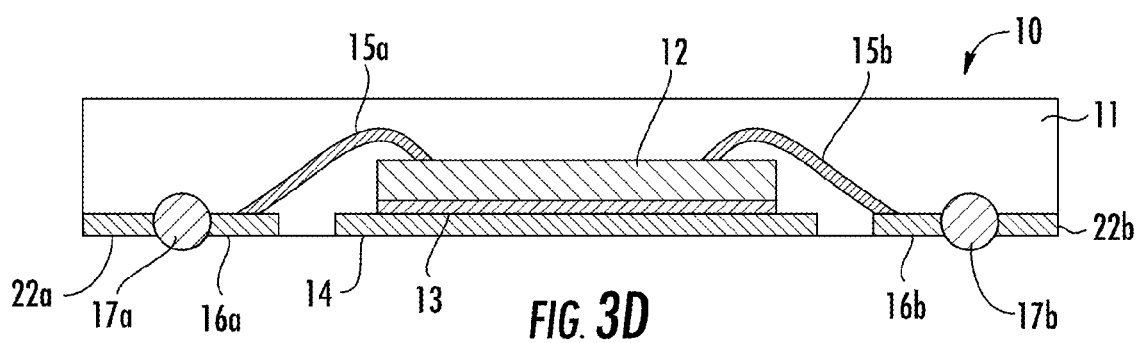

Referring initially to FIGS. 3A-3D, a semiconductor device 10 according to the present disclosure is now described. The semiconductor device 10 illustratively includes an IC 12, a plurality of lead frame contact areas 16a-16b adjacent the IC, each lead frame contact area having an opening 22a-22b therein, and a plurality of bond wires 15a-15b, each bond wire coupling a respective lead frame contact area with the IC. The semiconductor device 10 illustratively includes encapsulation material 11 surrounding the IC 12, the plurality of lead frame contact areas 16a-16b, and the plurality of bond wires 15a-15b. The semiconductor device 10 also illustratively includes a plurality of solder balls 17a-17b, each solder ball being within a respective opening 22a-22b and comprising at least a tin material, for example.

In the illustrated embodiment, each of the openings 22a-22b comprises a through-opening extending through the respective lead frame contact area 16a-16b, and each of the solder balls 17a-17b fills the respective through-opening and extends outwardly therefrom.

Additionally, each of the solder balls 17a-17b is laterally spaced outwardly from the distal end or termination of a respective bond wire 15a-15b. The semiconductor device 10 illustratively includes an IC die pad 14 below the IC 12. The semiconductor device 10 illustratively includes an adhesive layer 13 between the IC 12 and the IC die pad 14. For example, in the illustrated embodiment, each lead frame contact area 16a-16b may have a rectangular shape. The plurality of lead frame contact areas 16a-16b and the plurality of bond wires 15a-15b may comprise copper, although other materials may also be suitable, as would be appreciated by those skilled in the art.

As will also be appreciated, the semiconductor device 10 provides a ball grid array (BGA) surface package. The semiconductor device 10 may provide an approach to the problems of difficulty in producing thin BGA packages using very low solder bump height, the detached solder ball problem, and/or difficulty in producing a low cost BGA package. Advantageously, the semiconductor device 10 may be manufactured in a tapeless lead frame process, and while providing low-profile solder balls 17a-17b.

Another aspect is directed to a method for making a semiconductor device 10. The method may include positioning a plurality of lead frame contact areas 16a-16b adjacent at least one IC 12, with each lead frame contact area having an opening 22a-22b therein. The method may include forming a plurality of bond wires 15a-15b between a respective lead frame contact area and the at least one IC, and forming encapsulation material 11 to surround the at least one IC, the plurality of lead frame contact areas, and the plurality of bond wires. The method may also include forming a plurality of solder balls 17a-17b, with each solder ball being within a respective opening 22a-22b.

In particular, the method begins with providing a lead frame 18 having a plurality of recesses 21a-21b. The lead frame 18 is subjected to a top side etching to define the recesses 21a-21b. The method includes forming the plurality of solder balls 17a-17b (e.g. a solder reflow process). Since the solder balls 17a-17b are attached from the encapsulation material 11 side, the solder balls have improved anchor strength.

The method also includes attaching the IC 12 via the adhesive layer 13. The method also includes forming the plurality of bond wires 15a-15b, and forming the encapsulation material 11 to cover the plurality of solder balls 17a-17b, the plurality of bond wires 15a-15b, and the IC 12.

Lastly, the method includes a bottom side etching to expose the plurality of solder balls 17a-17b. This etching comprises two steps. The first etching removes copper from the bottom portion of the molded lead frame 18 through a series of chemical reactions using an alkaline/ammoniacal solution to expose the plurality of solder balls 17a-17b. The second etching is an additional step to remove the remaining thin intermetallic materials that may be formed around the plurality of solder balls 17a-17b. This intermetallic-removing step could. use the ferric nitrate component used to remove the intermetallic layer that forms when the tin and copper diffuse into each other. These approaches also contain wetting agents, copper etching inhibitors, and anti-tarnishing agents. Some other chemicals could also be used to remove the intermetallic materials, such as Electro-Brite Solder Stripper 819 (which removes the remaining copper-tin intermetallic layer and this peroxide/fluoride step is non-chelated, free rinsing and provides a clean copper surface), and SS2 Copper Conditioner (which removes the tin/copper intermetallic leaving behind a bright copper surface).

Helpfully, the solder ball 17a-17b height can be adjusted by controlling the lead frame 18 top or bottom etch to the desired value. So the solder bump 17a-17b can be as low as possible, which provides a very thin BGA package.

The typical electronic devices 100, 200 may suffer from several issues, such as a lack of low-profile BGA, detachment of solder balls, and/or high manufacturing cost. Advantageously, the semiconductor device 10 may provide some benefits over the prior art. In particular, the semiconductor device 10 may provide advantages as compared to laminate or substrate based BGA package. In particular, the semiconductor device 10 may have a lower cost because it's using the lead frame 18. Also, the semiconductor device 10 may avoid the detached solder ball issue since the solder balls 17a-17b are attached from the device/mold side with extra mechanical anchoring.

Additionally, the semiconductor device 10 may provide advantages as compared to an existing lead frame based BGA. In particular, the semiconductor device 10 may provide better performance against detached solder balls, since existing BOA packages have solder balls attached from the bottom side of the package with no extra solder anchoring.

Figure 4A:
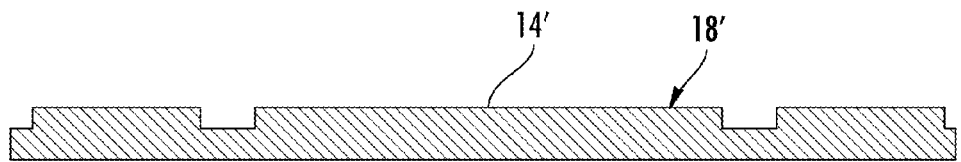
FIGS. 4A-4E are schematic diagrams of cross-sectional views of steps in making another embodiment of the semiconductor device, according to the present disclosure.
Figure 4B:
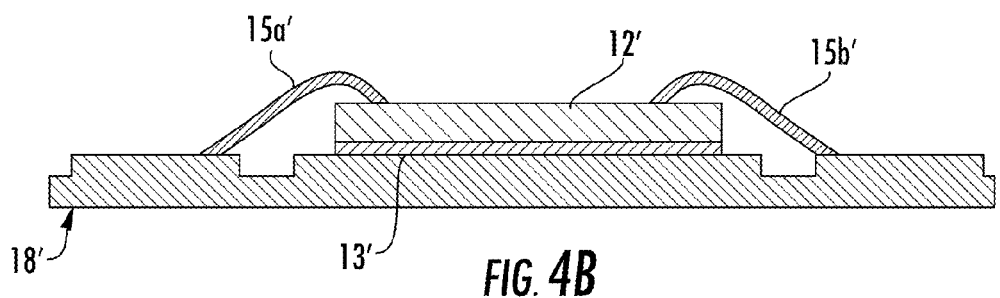
Figure 4C:
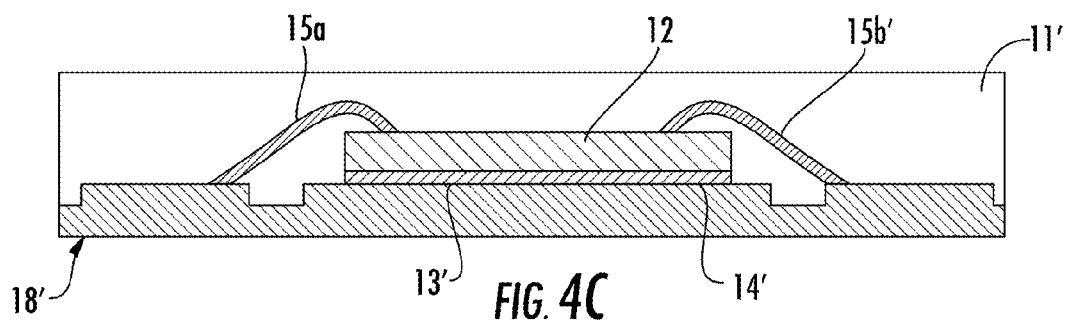
Figure 4D:
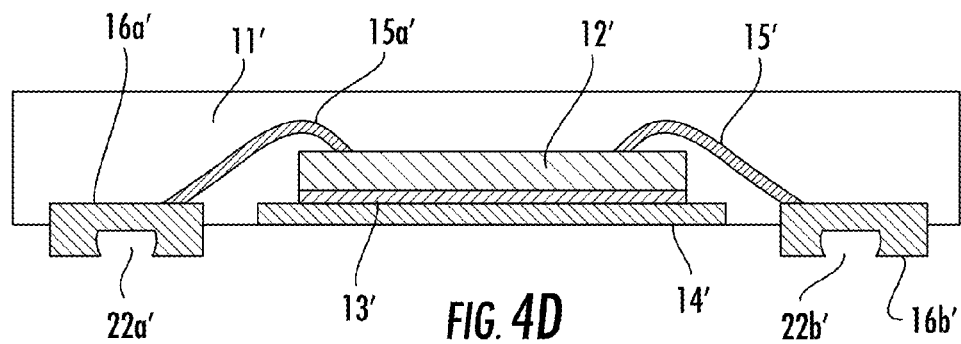
Figure 4E:
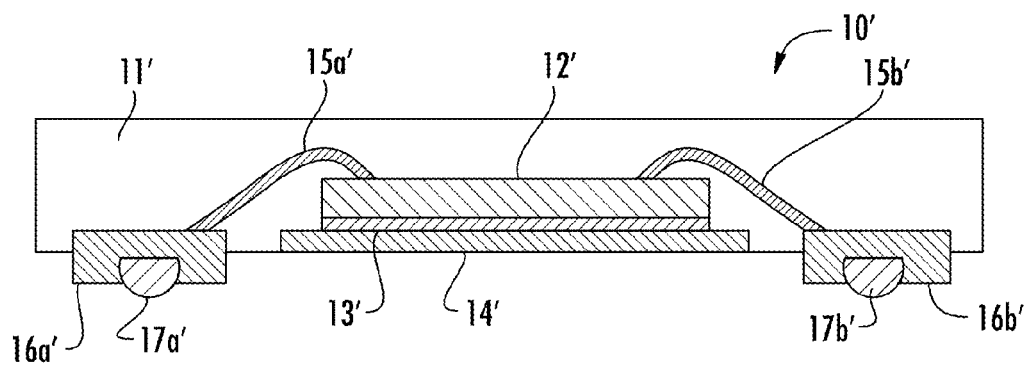

Referring now additionally to FIGS. 4A-4E, another embodiment of the semiconductor device 10' and the method for making the same is now described. In this embodiment of the semiconductor device 10', those elements already discussed above with respect to FIGS. 3A-3D are given prime notation and most require no further discussion herein. This embodiment differs from the previous embodiment in that this semiconductor device 10' includes openings, with each comprising a blind-opening 22a'-22b' extending partially through the respective lead frame contact area 16a'-16b'. Also, each of the solder balls 17a'-17b' is positioned to fill the respective blind-opening 22a'-22b' and extends outwardly therefrom.

Also, the method for making this embodiment of the semiconductor device 10' differently delays the formation of the plurality of solder balls 17a'-17b' to be subsequent to the second etching. Also, as perhaps best seen in FIG. 4D, the second etching step provides a plurality of recesses 22a'-22b' with an undercut feature (i.e. the outermost portion of the etched lead frame 18' protrudes over the recess to provide improved anchoring for the solder balls 17a'-17b').

Many modifications and other embodiments of the present disclosure will come to the mind of one skilled in the art having the benefit of the teachings presented in the foregoing descriptions and the associated drawings. Therefore, it is understood that the present disclosure is not to be limited to the specific embodiments disclosed, and that modifications and embodiments are intended to be included within the scope of the appended claims.

That which is claimed is:

1. A semiconductor device comprising:
   at least one integrated circuit (IC);
   a plurality of lead frame contact areas adjacent the at least one IC, each lead frame contact area having blind-opening extending therethrough;
   each blind-opening having an inner width, and an outer width less than the inner width;
   a plurality of bond wires, each bond wire coupling a respective lead frame contact area with the at least one IC;
   encapsulation material surrounding said at least one IC, said plurality of lead frame contact areas, and said plurality of bond wires; and
   a plurality of solder balls, each solder ball being within a respective blind-opening.

2. The semiconductor device of claim 1 wherein each of said plurality of solder balls fills the respective blind-opening and extends outwardly therefrom.

3. The semiconductor device of claim 1 wherein each of said plurality of solder balls is laterally spaced outwardly from a respective bond wire.

4. The semiconductor device of claim 1 further comprising at least one IC die pad below said at least one IC.

5. The semiconductor device of claim 4 further comprising an adhesive layer between said at least one IC and said at least one IC die pad.

6. The semiconductor device of claim 1 wherein each lead frame contact area has a rectangular shape.

7. The semiconductor device of claim 1 wherein said plurality of lead frame contact areas comprises copper.

8. A semiconductor device comprising:
at least one integrated circuit (IC);
a plurality of lead frame contact areas adjacent said at least one IC, each lead frame contact area having a through-opening extending therethrough;
a plurality of bond wires, each bond wire coupling a respective lead frame contact area with said at least one IC;
encapsulation material surrounding said at least one IC, said plurality of lead frame contact areas, and said plurality of bond wires; and
a plurality of solder balls, each solder ball filling a respective through-opening so that a diameter of each solder ball is aligned with a respective lead frame contact area, the diameter dividing each solder ball into a first hemisphere being completely surrounded by said encapsulation material and adjacent portions of the respective lead frame contact area.

9. The semiconductor device of claim 8 further comprising at least one IC die pad below said at least one IC.

10. The semiconductor device of claim 9 further comprising an adhesive layer between said at least one IC and said at least one IC die pad.

11. The semiconductor device of claim 8 wherein each lead frame contact area has a rectangular shape.

12. A method for making a semiconductor device comprising:
positioning a plurality of lead frame contact areas adjacent at least one IC, each lead frame contact area having a blind-opening extending therethrough, each blind-opening having an inner width, and an outer width less than the inner width;
coupling a plurality of bond wires between a respective lead frame contact area and the at least one IC;
forming encapsulation material surrounding the at least one IC, the plurality of lead frame contact areas, and the plurality of bond wires; and
forming a plurality of solder balls, each solder ball being within a respective blind-opening.

13. The method of claim 12 wherein each of the plurality of solder balls fills the respective blind-opening and extends outwardly therefrom.

14. The method of claim 12 wherein each of the solder balls is laterally spaced outwardly from a respective bond wire.

15. A method for making a semiconductor device comprising:
positioning a plurality of lead frame contact areas adjacent at least one IC, each lead frame contact area having a through-opening extending therethrough;
coupling a plurality of bond wires between a respective lead frame contact area and the at least one IC;
forming encapsulation material surrounding the at least one IC, the plurality of lead frame contact areas, and the plurality of bond wires; and
forming a plurality of solder balls, each solder ball being within a respective through-opening and so that a diameter of each solder ball is aligned with a respective lead frame contact area, the diameter dividing each solder ball into a first hemisphere being completely surrounded by said encapsulation material and adjacent portions of the respective lead frame contact area.

16. The method of claim 15 wherein each of the plurality of solder balls is laterally spaced outwardly from a respective bond wire.

17. The method of claim 15 further comprising positioning at least one IC die pad below the at least one IC.

18. The method of claim 17 further comprising forming an adhesive layer between the at least one IC and the at least one IC die pad.

* * * * *

UNITED STATES PATENT AND TRADEMARK OFFICE
CERTIFICATE OF CORRECTION

| | | |
|---|---|---|
| PATENT NO. | : 9,165,867 B1 | Page 1 of 1 |
| APPLICATION NO. | : 14/449492 | |
| DATED | : October 20, 2015 | |
| INVENTOR(S) | : Ela Mia Cadag and Jefferson Talledo | |

It is certified that error appears in the above-identified patent and that said Letters Patent is hereby corrected as shown below:

Claims
Column 4, Line 56,     Delete: "blind"
Claim 1                Insert --a blind--

Signed and Sealed this
Twenty-second Day of March, 2016

Michelle K. Lee
*Director of the United States Patent and Trademark Office*